(12) United States Patent
Knaeble

(10) Patent No.: US 10,157,551 B1
(45) Date of Patent: Dec. 18, 2018

(54) INSTRUCTIONAL TOOL FOR TEACHING STATISTICS CONCEPTS

(71) Applicant: Brian Robert Knaeble, Eden Prairie, MN (US)

(72) Inventor: Brian Robert Knaeble, Eden Prairie, MN (US)

( * ) Notice: Subject to any disclaimer, the term of this patent is extended or adjusted under 35 U.S.C. 154(b) by 500 days.

(21) Appl. No.: 14/863,421

(22) Filed: Sep. 23, 2015

Related U.S. Application Data

(60) Provisional application No. 62/054,217, filed on Sep. 23, 2014.

(51) Int. Cl.
  *G09B 23/02* (2006.01)
  *G06F 17/50* (2006.01)
  *G06F 17/18* (2006.01)

(52) U.S. Cl.
  CPC .............. *G09B 23/02* (2013.01); *G06F 17/18* (2013.01); *G06F 17/5009* (2013.01)

(58) Field of Classification Search
  CPC ......... G09B 23/02; G06F 17/50; G06F 17/18; G06F 17/5009
  USPC ......................................................... 434/188
  See application file for complete search history.

(56) References Cited

U.S. PATENT DOCUMENTS

| | | | | |
|---|---|---|---|---|
| 4,900,255 A * | 2/1990 | Laghi | ..................... | G09B 19/00 434/188 |
| 5,066,233 A * | 11/1991 | Laghi | ..................... | G09B 23/02 434/188 |
| 5,080,592 A * | 1/1992 | Laghi | ..................... | G09B 23/02 434/188 |
| 5,690,591 A * | 11/1997 | Kenmochi | ............. | A63B 69/18 434/253 |
| 2009/0100928 A1 * | 4/2009 | Fry | ........................ | G01N 19/02 73/491 |
| 2014/0060149 A1 * | 3/2014 | Alhusain | ................ | G01N 19/02 73/9 |

OTHER PUBLICATIONS

Ron Kurtus, Friction Experiment: Measure Coefficient of Friction with a Ramp, Nov. 2012, Wayback Machine.*
Wikipedia, Bean Machine, Galton, http://en.wikipedia.org/wiki/Galton_Board, prior to Sep. 23, 2014. (3 pages).
Video, Normal Distribution Demonstration (Bean Machine Script for Physion) http://www.youtube.com/watch?v=PM7z_03o_kk, prior to Sep. 23, 2014. (2 pages).
Quincunx, http://www.mathisfun.com/data/quincunx.html, prior to Sep. 23, 2014. (1 page).
Hirano & Imbens, "The Propensity Score with Continuous Treatments", Feb. 7. 2004. (pp. 1-13).

* cited by examiner

*Primary Examiner* — Eddy Saint-Vil
(74) *Attorney, Agent, or Firm* — Deirdre M Kvale; DMK Intellectual Property Law

(57) ABSTRACT

A simulation tool or application for teaching statistics concepts. The tool utilizes various propensity and treatment inputs to simulate outcome responses for subject elements. In illustrated embodiments, the subject elements have the same or similar characteristics and outcome response while in other embodiments the subject elements have different characteristics and outcome response. The tool applies various propensity inputs to assign the subject elements to treatment or no-treatment to simulate treatments on different populations using different propensity mechanisms or inputs.

19 Claims, 18 Drawing Sheets

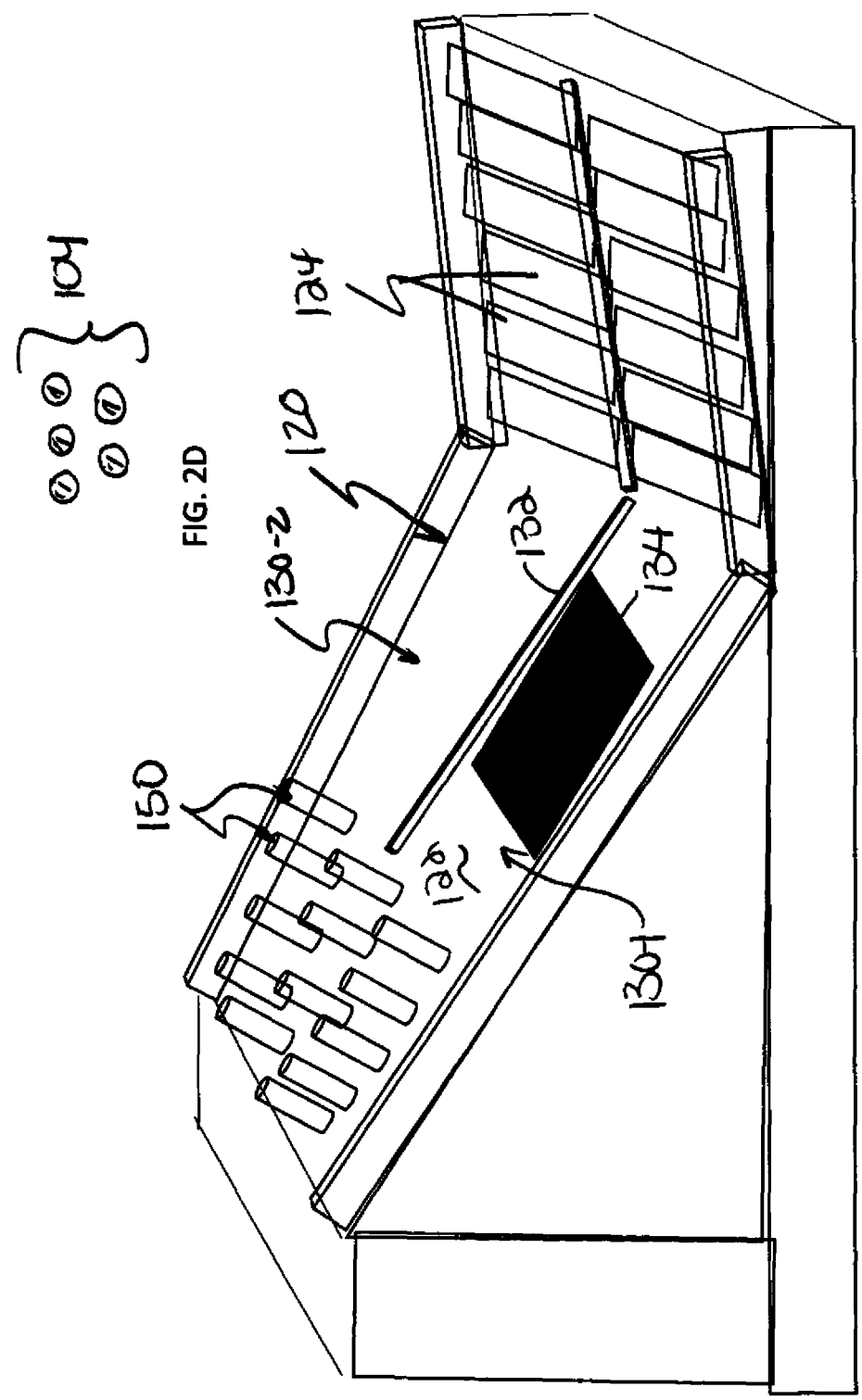

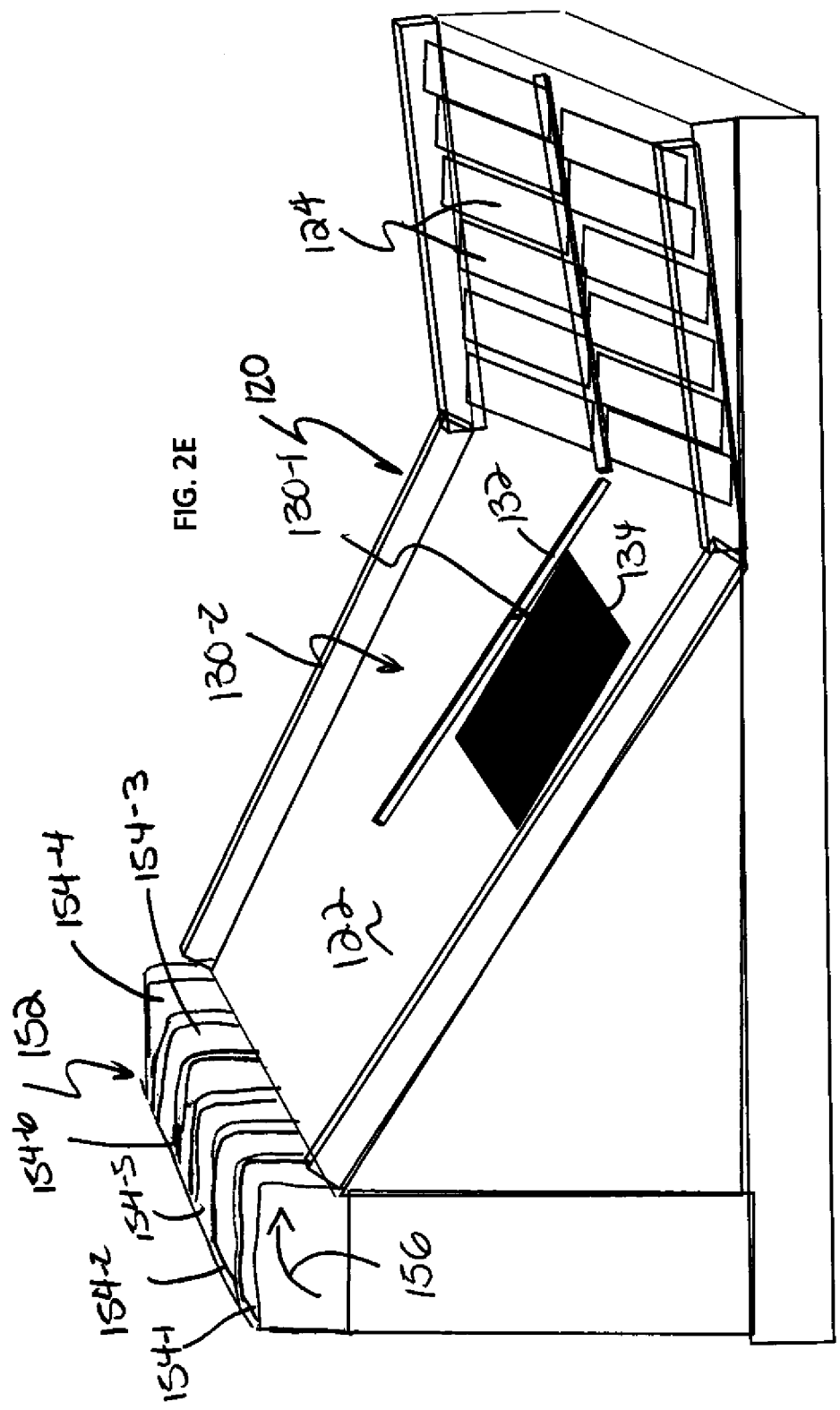

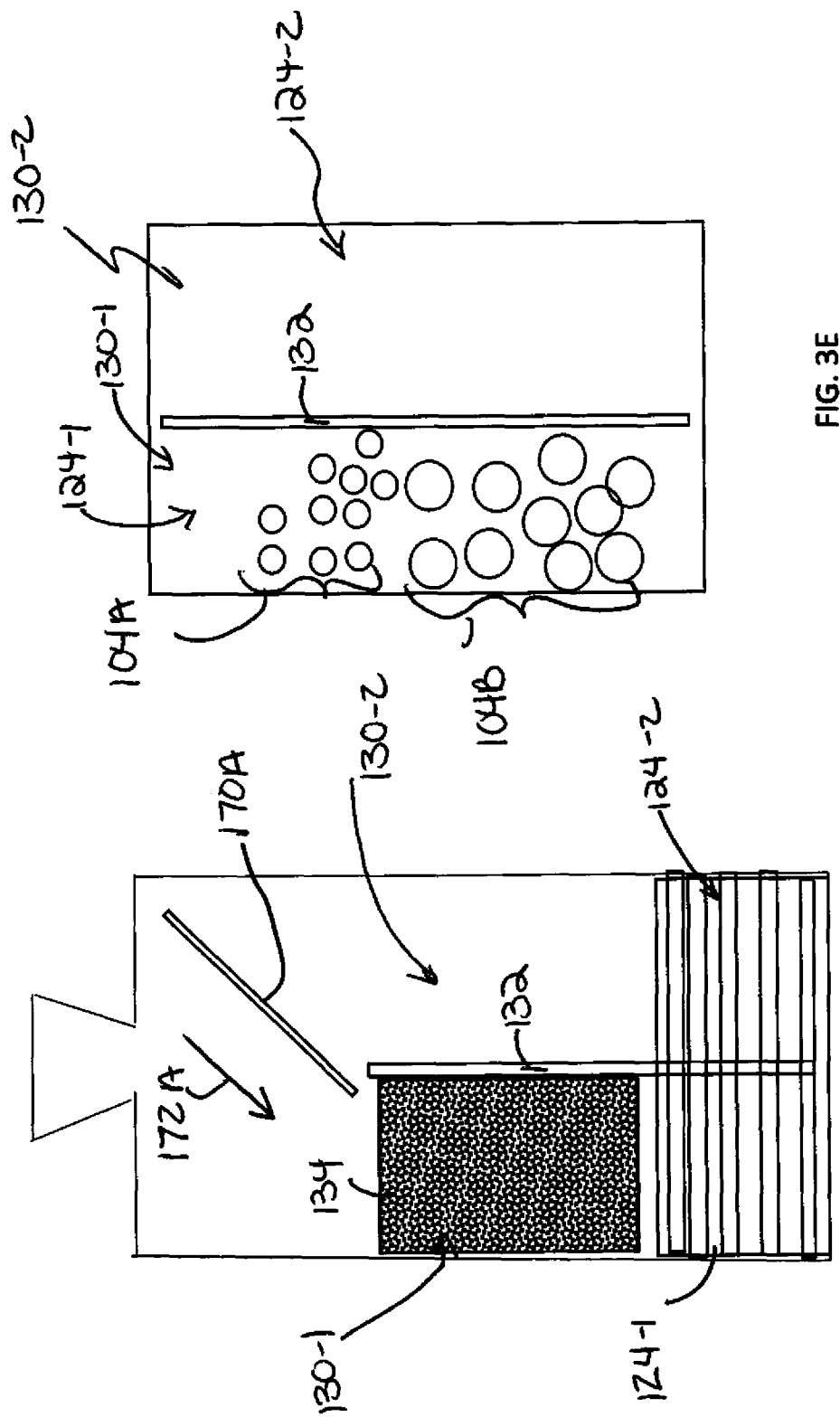

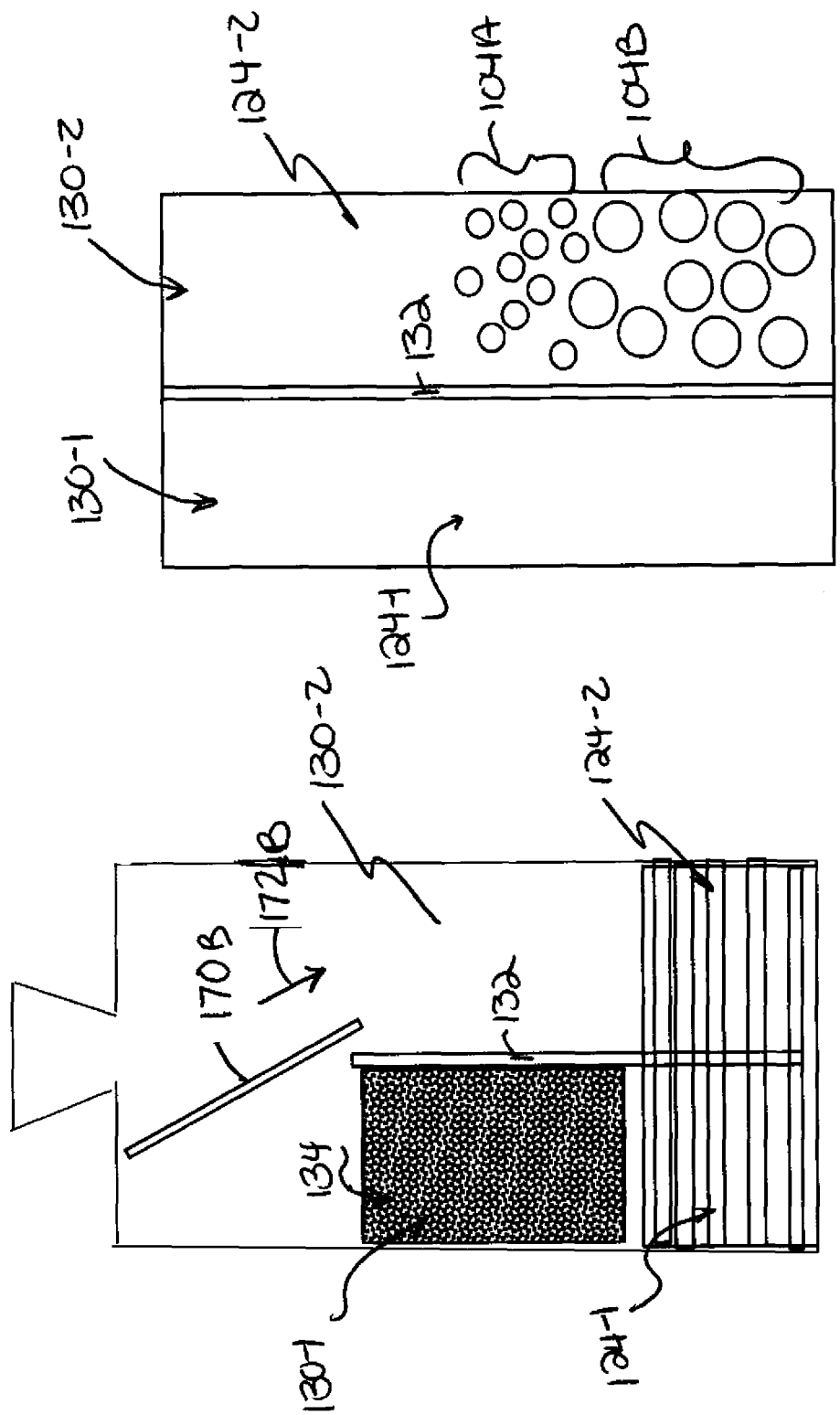

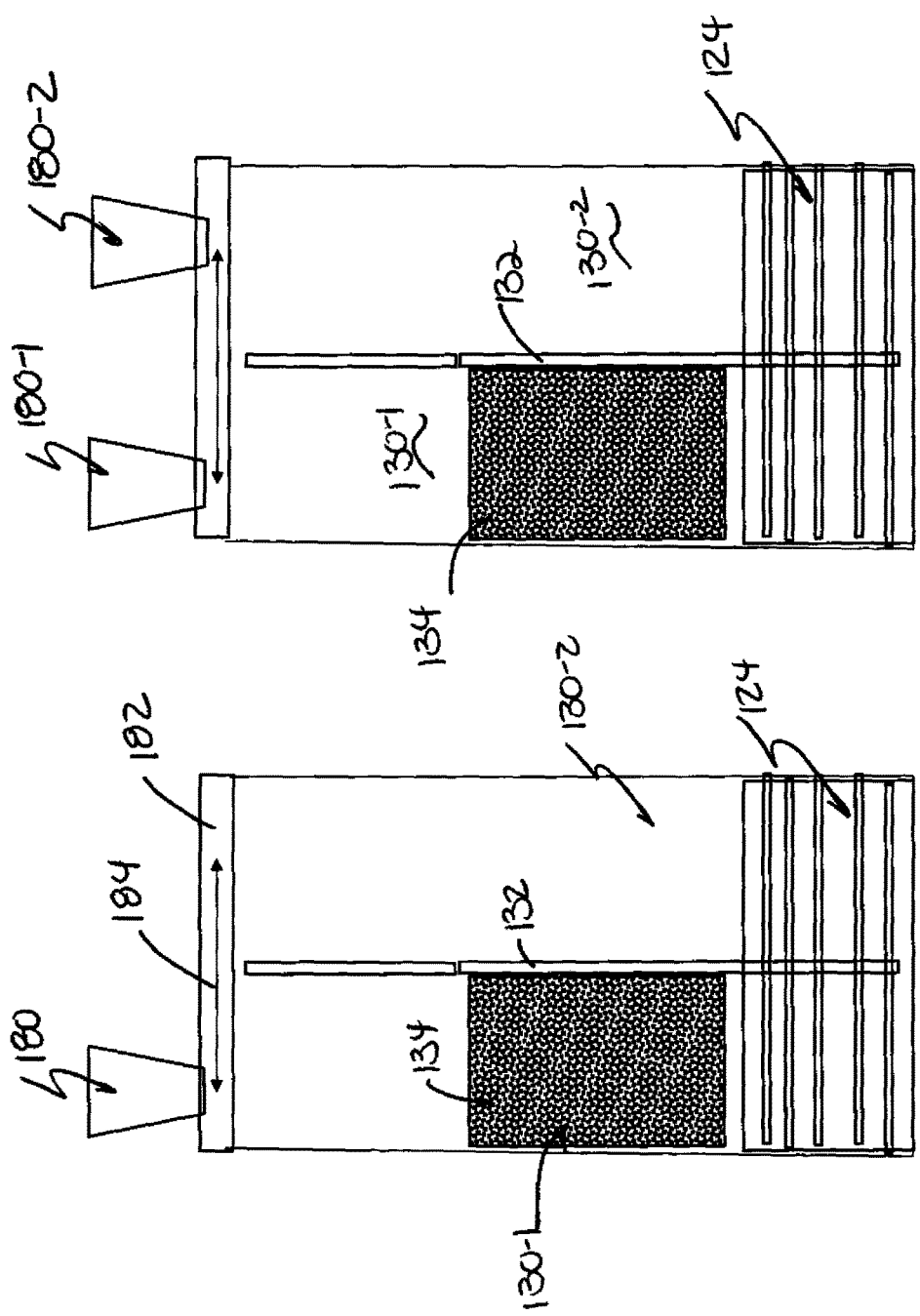

| | Weight H | Weight L | Friction H | Friction L | Size L | Size S | Propensity |
|---|---|---|---|---|---|---|---|
| 104A (A) | x | | | | x | | .8 |
| 104B (B) | | x | x | | | x | .2 |
| 104C (C) | x | x | x | | x | | .6 |
| 104D (D) | | x | | x | | x | .4 |
| 104E (E) | x | x | x | x | x | | .6 |
| 104F (F) | | x | | x | | x | .4 |
| 104G (G) | | x | | x | x | | .5 |
| 104H (H) | x | | x | x | | x | .4 |
| 104I (I) | x | x | | x | x | x | .7 |
| 104J (J) | | | | | | | .6 |
| 104K (K) | | x | | | x | | .3 |
| 104L (L) | x | | | x | | x | .7 |

FIG. 4

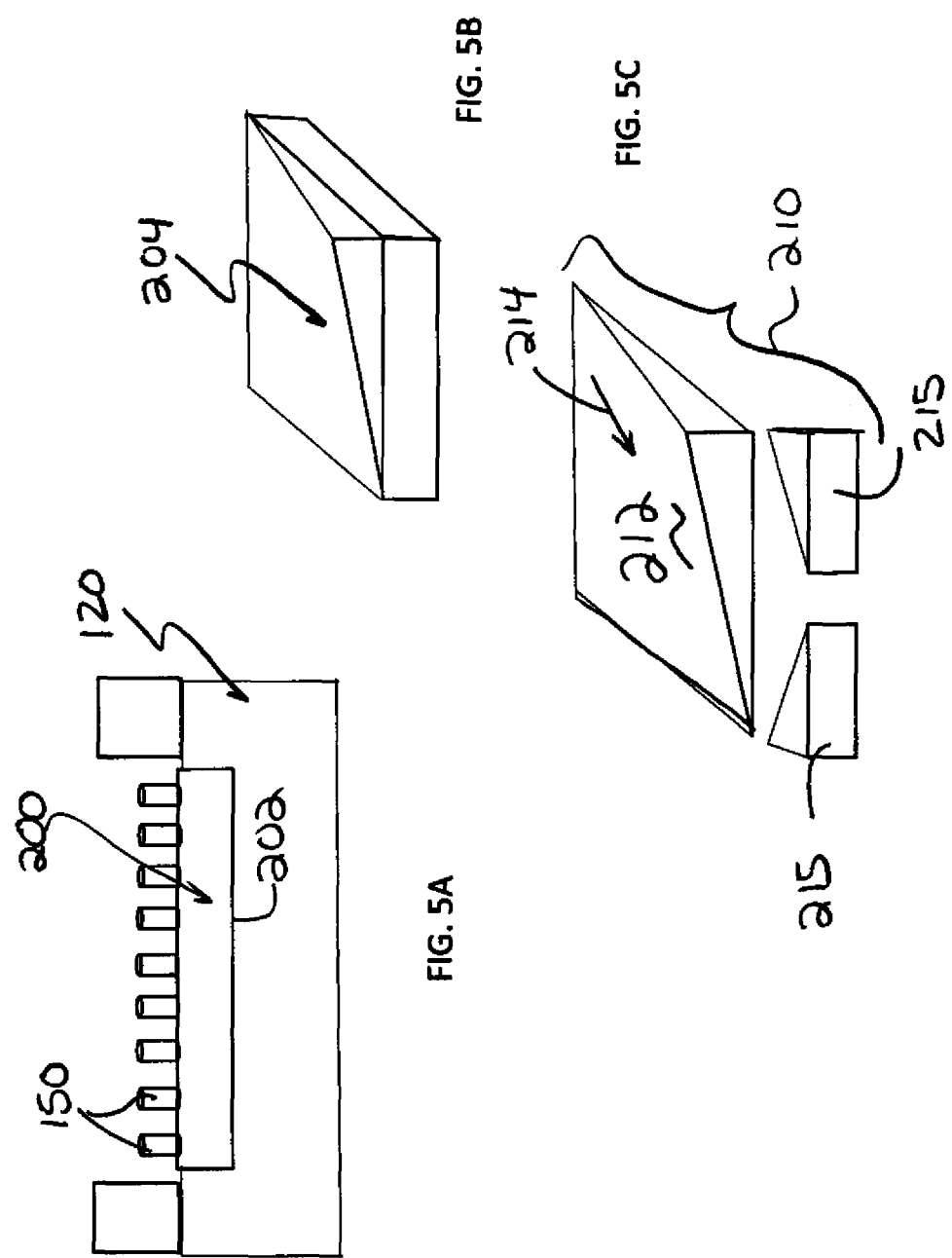

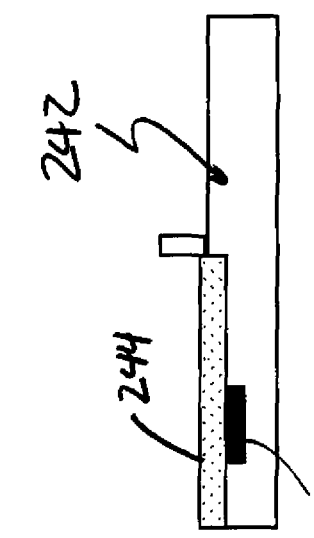
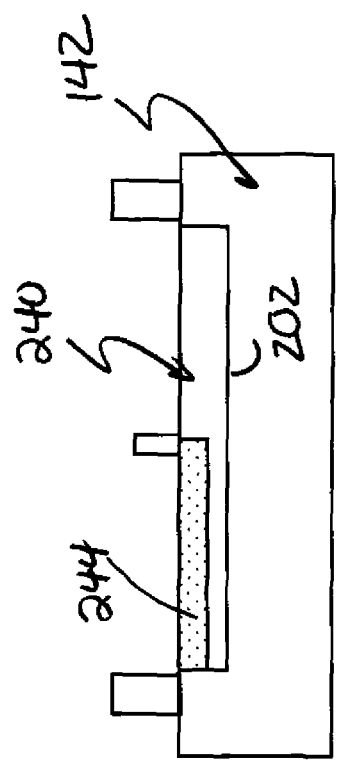
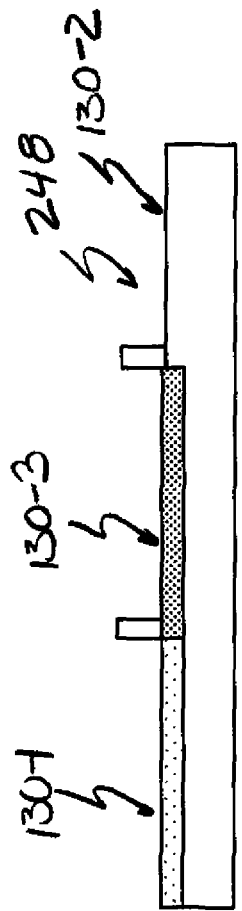

US 10,157,551 B1

INSTRUCTIONAL TOOL FOR TEACHING STATISTICS CONCEPTS

CROSS-REFERENCE TO RELATED APPLICATION

The present application claims priority to U.S. Provisional Application Ser. No. 62/054,217 filed Sep. 23, 2014 and entitled INSTRUCTIONAL TOOL FOR TEACHING STATISTICAL CONCEPTS, which is incorporated by reference in its entirety into the present application.

BACKGROUND

Statistics concepts are often taught using terms and formulas through traditional teaching methods. Students can have a hard time understanding the effect of various inputs on a subject population. Traditional teaching methods do not allow for students to conceptually visualize various statistics concepts and effects of treatment on subject populations having different characteristics.

SUMMARY

The present application relates to a tool for teaching statistics concepts. The tool utilizes various propensity inputs and treatments to simulate outcome responses for subject elements. In illustrated embodiments, the subject elements have the same or similar characteristics and outcome response while in other embodiments the subject elements have different characteristics and outcome responses. The tool applies various propensity inputs and treatments and provides an output measure or score distribution to illustrate different statistics concepts.

BRIEF DESCRIPTION OF THE DRAWINGS

FIG. 2D illustrates an embodiment of the ramp structure shown in FIG. 2A having a random propensity input mechanism.

FIG. 2E illustrates an embodiment of the ramp structure shown in FIG. 2A utilizing a hopper structure to provide an assignable propensity input mechanism for subject elements.

FIG. 3D illustrates a ramp structure having a one-way propensity input to a treatment path.

FIG. 3E illustrates an output measure or distribution for different subject elements directed to the treatment path via the one-way propensity input illustrated in FIG. 3D.

FIG. 3F illustrates a ramp structure having a one-way propensity input to a non-treatment path.

FIG. 3G illustrates an output measure or distribution for different subject elements directed to the non-treatment path via the one-way propensity input illustrated in FIG. 3F.

FIG. 3H illustrates implementation of a one-way propensity input via an adjustable hopper.

FIG. 3I illustrates multiple hoppers to provide a propensity input mechanism for subject elements depending upon user preference.

FIG. 4 illustrates a population of subject elements or balls for propensity matching.

FIGS. 5A-5C illustrate different insets for adapting the ramp structure illustrated in FIG. 2A for different propensity or manipulative inputs.

FIG. 7A illustrates an embodiment of a ramp structure with a treatment inset.

FIGS. 7B-7C illustrate embodiments of different treatment insets for a ramp structure as illustrated in FIG. 2A.

DETAILED DESCRIPTION OF ILLUSTRATIVE EMBODIMENTS

Figure 1:
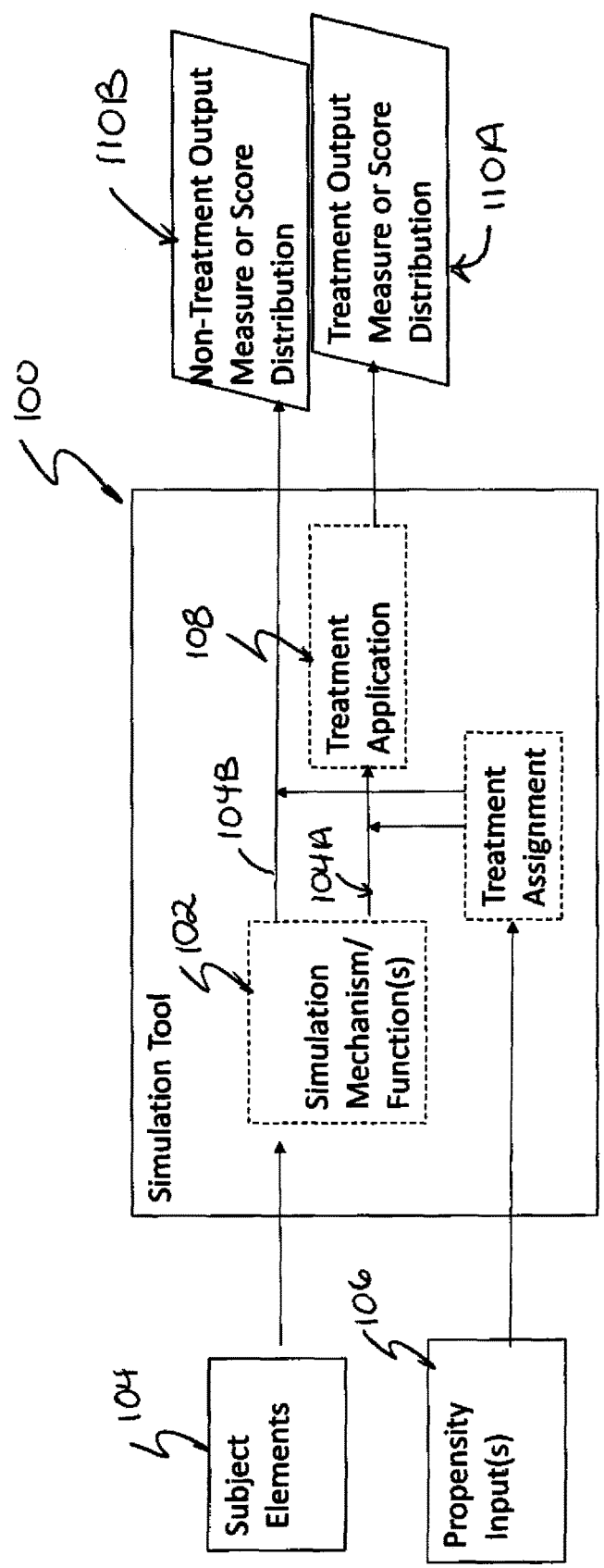
FIG. 1 is a schematic illustration of an instructional tool for illustrating different statistics concepts.

The present application relates to an instructional tool 100 for illustrating and teaching statistics concepts. The instruction tool 100 allows the user to simulate the effects of various treatments on various populations using different treatment inputs and propensity to treatments to observe and analyze the output results for different simulations. As schematically shown in FIG. 1, embodiments of the tool 100 include simulation mechanism(s) or functions 102 to provide an output measure or score for subject elements 104 responsive to characteristics of the subject elements 104. As shown, the tool 100 utilizes an input propensity 106 to assign subject elements 104A to a treatment application 108 while subject elements 104B are not subject to the treatment application 108. Treatment is applied to increase or decrease the output measure or score of subject elements to provide an output treatment measure or score distribution 110A for the subject elements 104A and an output non-treatment measure or score distribution 110B for the subject elements 104B. In illustrated embodiments, the treatment inputs from the treatment application 108 additively or negatively affect the output measure or score for the treated subject elements 104A. The subject elements 104 include sets of subject elements with common characteristics that provide the same or similar output response to simulation and treatment inputs and subject elements 104 with different characteristics that provide different output responses to simulation and treatment inputs. As will be described herein, the different treatment inputs and sets of subject elements are used to illustrate different treatments and outcomes for different subject populations.

Figure 2A:
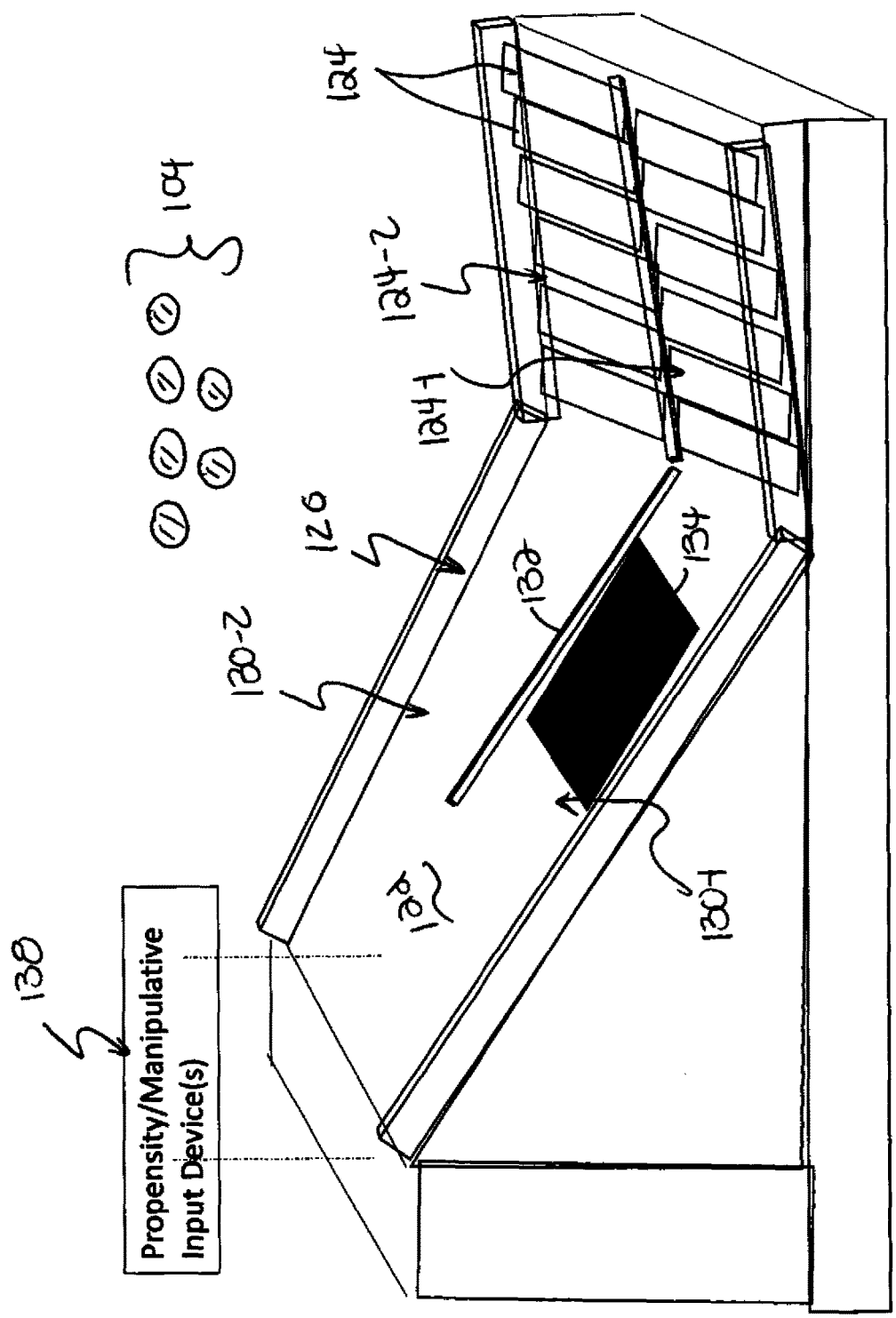
FIG. 2A illustrates an embodiment of an instruction tool utilizing a ramp structure for implementing different treatment and propensity inputs.

FIG. 2A schematically illustrates an embodiment of the instruction tool 100 utilizing a ramp structure 120 to provide a simulation input to subject element balls 104. The ramp structure 120 includes an inclined ramp surface 122 which applies an input momentum or acceleration at the top of the ramp structure 120 to roll balls 104 down the ramp surface 122. A bottom of the ramp structure 120 is sloped to slow the momentum of the subject elements or balls 104 to provide an output measurement or distance. As shown scoring tiles or blocks 124 are provided at the bottom of the ramp structure 120 to provide the outcome measure or travel distances of the balls 104. In the illustrated embodiment, the bottom of the ramp structure 120 is sloped to slow the subject element balls, however, application is not limited to the particular structure or arrangement shown. Balls 104 having different characteristics or weights will have different output distance measurements. In the embodiment shown, the scoring tiles 124 are spaced or graduated to provide a desired output score distribution. In an illustrated embodiment, the smaller the travel distance, the higher the score measurement, although application is not limited to a particular score methodology. In one embodiment (not shown) the scoring tiles 124 are sloped towards an outer edge of the ramp to limit interference between the scored balls and the balls rolling down the ramp surface 122.

In the embodiment shown in FIG. 2A the ramp structure 120 includes a treatment path 130-1 and a non-treatment path 130-2 separated by divider 132 extending along the treatment and non-treatment paths 130-1, 130-2. The treatment path 130-1 includes a treatment device or mechanism 134 along the ramp surface 122 above or preceding the scoring tiles 124. The divider 132 as shown extends along the scoring tiles 124 to separate the subject elements for measurement along a treatment side scoring tiles 124-1 and non-treatment side scoring tiles 124-2. The balls or subject elements 104 are assigned to one of the multiple treatment paths 130-1, 130-2 based upon a propensity input or mechanism 138 (illustrated schematically). The treatment device or mechanism 134 increases or decreases the momentum and output distance or score of the subject element balls 104. In the illustrated embodiment the treatment device is a pad having an increased surface friction relative to the sloped ramp surface 122 to slow or retard velocity of the subject balls 104 to reduce the output distance of subject elements compared to the non-treatment path 130-2 having no increased surface friction relative to the surface of the ramp 122. Thus, the treatment path 130-1 provides a higher surface friction than the no-treatment path 130-2 to provide a negative input that reduces the outcome distance.

Illustratively, the treatment and non-treatment paths 130-1, 130-2 simulate a statistical study of the effect of treatment, such as a drug treatment vs a placebo treatment on a subject population through illustration of the outcome measurements or distribution of the treated and non-treated subject elements 104 of the tool. The subject elements 104 of the tool can include a set of subject elements having the same weight, size and surface friction characteristics to provide a similar output score prior to treatment or the set of subject elements 104 can have different weight, size and surface friction characteristics for various simulations as will be described.

Figure 2B:
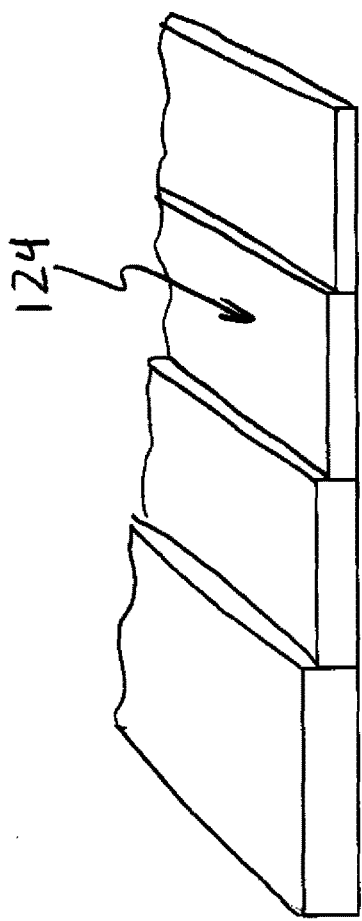
FIG. 2B is a detailed view of an embodiment of score tiles at a bottom of the ramp structure of FIG. 2A.
Figure 2C:
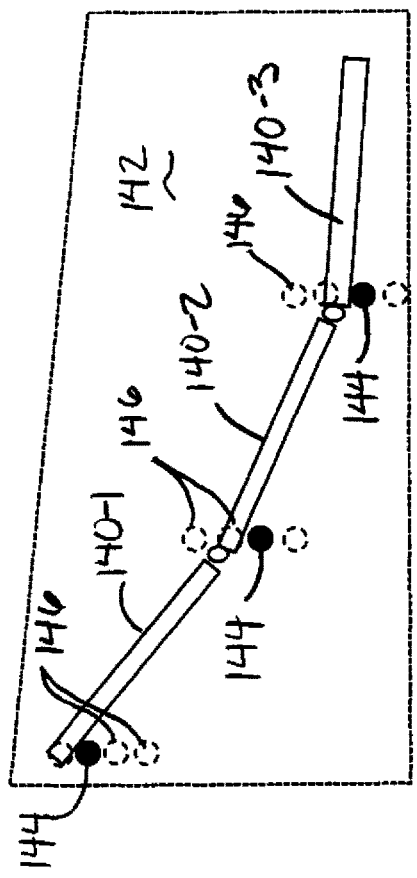
FIG. 2C illustrates a ramp surface including adjustable ramp sections or platforms for adjusting slope or inclination of the ramp surface and sections.

FIG. 2B is a detailed view of one embodiment of the scoring tiles 124 for providing an output measure or distribution for the subject element 104. As shown, the scoring tiles 124 are evenly spaced and stepped to provide a distinctive score distribution. It should be understood that application is not limited to the specific scoring tiles shown having a uniform spacing, and in alternate embodiments the spacing or distribution of tiles can be non-uniform, such as a non-uniform pattern 1.2..3...4....5.....6......7.......8........9.........10 to provide a useful output distribution. In an illustrated embodiment shown in FIG. 2C, the ramp structure 120 include multiple platform sections 140-1, 140-2, 140-3 supported by a frame structure 142 (illustrated in phantom).

The platform sections 140-1, 140-2, 140-3 are hingedly connected to separately adjust the inclination angle of each of the platform sections 140-1, 140-2, 140-3. In the embodiment shown, the ramp structure 120 includes three platform sections including a top section 140-1, a treatment section 140-2 and a bottom scoring section 140-3. The treatment and non-treatment paths 130-1, 130-2 are along the treatment section 140-2 and the scoring tiles 124 are along the bottom section 140-3. As schematically shown in the illustrated embodiment the inclination is adjusted by adjusting a height or elevation of dowels 144 supporting each of the platform sections 140-1 through 140-3. As shown, the frame 142 of the ramp structure 120 includes a plurality of dowel slots 146 (illustrated in phantom) at different height elevations. The inclination angles of the platform sections 140-1, 140-2, 140-3 are adjusted by raising or lowering the dowels 144 by inserting the dowels in different slots 146 at different height elevations.

As previously described in FIG. 1, the tool uses a propensity input to assign the subject elements to follow the treatment path 130-1 or the non-treatment path 130-2. FIG. 2D illustrates an embodiment of a random propensity input mechanism to randomly assign subject elements 104 to the treatment path 130-1 and the non-treatment path 130-2. As shown, the random propensity input device includes a pattern of pegs 150. In an illustrative embodiment, the pegs 150 are supported between opposed boards (not shown) to provide structural rigidity for the pegs 150. The random propensity input mechanism is supported at the top of the ramp structure 120 above the treatment path 130-1 and non-treatment path 130-2 to randomly assign balls to the treatment path and the non-treatment path 130-2. As the balls 104 roll along the ramp surface 122, the balls 104 contact the pegs 150. The pegs 150 are patterned to randomly direct the balls 104 to either the treatment path 130-1 or the non-treatment or control path 130-2 to provide an ignorable treatment assignment. Thus some of the subject elements or balls 104 are randomly directed to the treatment path 130-1 and some to the non-treatment or control path 130-2. It should be understood, that application is not limited to cylindrical pegs 150 as shown, and other shapes or configurations can be used to randomly direct the subject elements or balls 104. For example, in an illustrative embodiment, the pegs 150 are semicircular shaped. The random propensity input mechanism provides simulation for same or different subject elements for random or ignorable treatment assignment.

FIG. 2E illustrates a hopper 152 that provides a selectable propensity input for subject elements or balls 104 to follow either the treatment path 130-1 over the non-treatment path 130-2 or the non-treatment path 130-2 over the treatment path 130-1. As shown, the hopper 152 includes a plurality of hopper bins 154-1 through 154-6 spaced between opposed sides of the ramp structure 120. The balls in bins 154-1, 154-2 have a higher propensity to follow the treatment path 130-1 while the balls in bins 154-3 and 154-4 have a higher propensity to follow the non-treatment path 130-2. The bins 154-5-154-6 between bins 154-1 154-2, 154-3, 154-4 have a lower propensity to follow either of the treatment or non-treatment paths 130-1, 130-2. Thus, the user can assign a propensity input to select subject elements via placement of the subject elements 104 in the bins 154-1 through 154-6 to simulate the effect of treatment assignment on outcome measures or distribution. The hopper 152 is hingedly connected to the ramp structure 120 and when full is rotated as illustrated by arrow 156 to dispense the subject elements or balls down the inclined ramp surface 122. The hopper 152 can be used in combination with a peg board with pegs 150 (not shown) to slow the balls and direct the balls to the treatment and non-treatment paths 130-1, 130-2 based upon the input propensity via hopper 152.

Figure 2F:
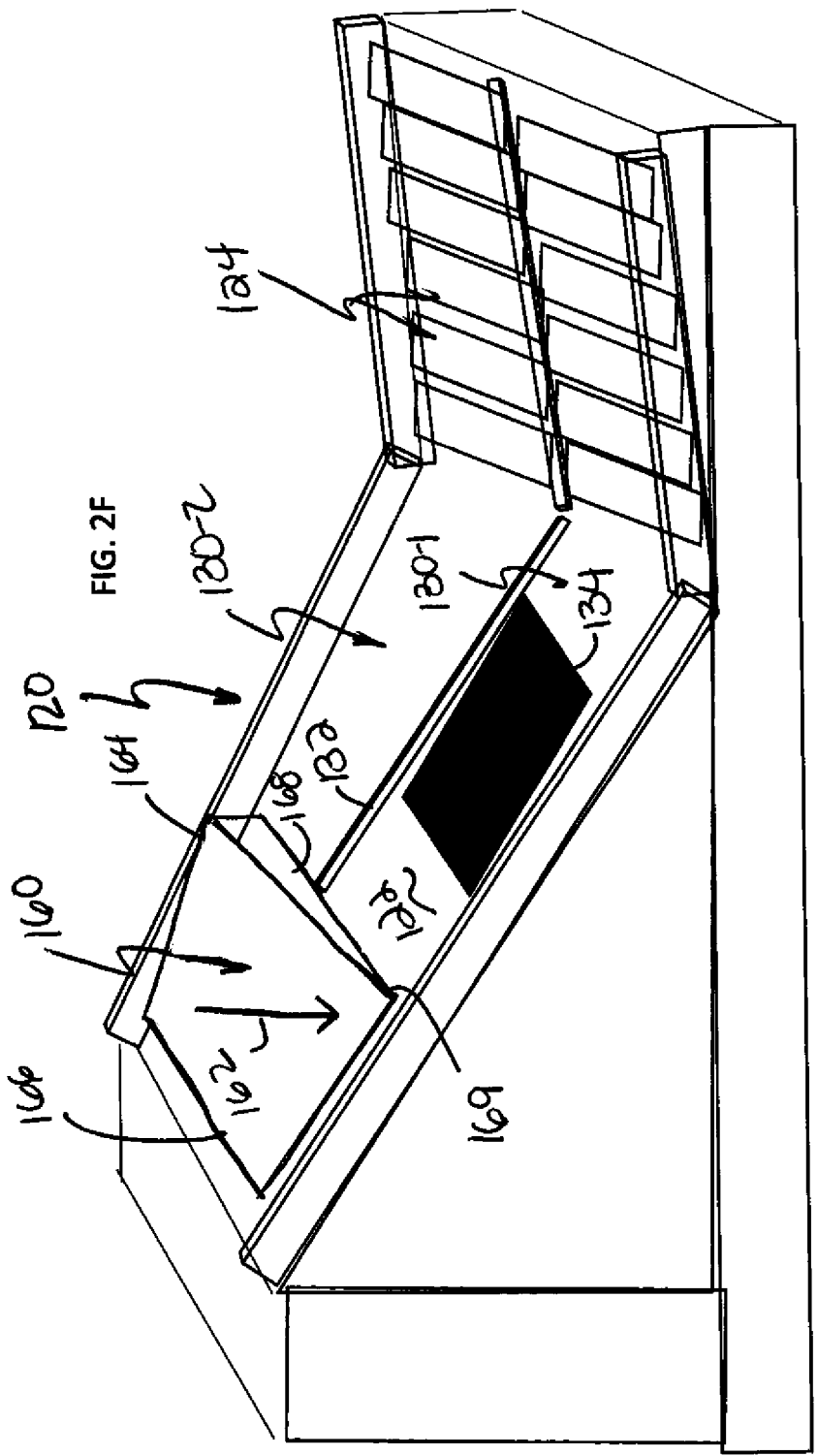
FIG. 2F illustrates an embodiment of the ramp structure shown in FIG. 2A utilizing a laterally sloped structure to provide a biased propensity and confounding input mechanism for subject elements.

FIG. 2F illustrates a ramp structure 120 utilizing a laterally sloped manipulative device 160 to provide a biased propensity and confounding input to the subject elements 104. As shown, the device 160 is laterally sloped toward the treatment path 130-1 to provide a bias propensity toward the treatment path 130-1 as illustrated by arrow 162. In particular, the sloped manipulative device 160 provides a higher propensity for the heavier or lower friction subject elements 104 to follow the treatment path 130-1 compared to the lower weight subject elements. The incline slope of the manipulative device 160 imparts momentum or confounding input to the balls 104 which increases momentum of the subject elements or balls 104 as will be described. In the embodiment shown, the device has a raised edge 164 that provides the sloped surface towards the treatment path 130-1. A leading edge 166 of device 160 is flush with the ramp surface and a trailing edge 168 includes the raised edge 164 to form the inclined slope toward a lower edge 169 or the treatment path 130-1 to increase the propensity for the subject elements (particularly heavier subject elements) to follow the treatment path 130-1. The sloped incline imparts momentum to the subject elements 104 for simulating a non-ignorable treatment assignment.

Figure 3A:
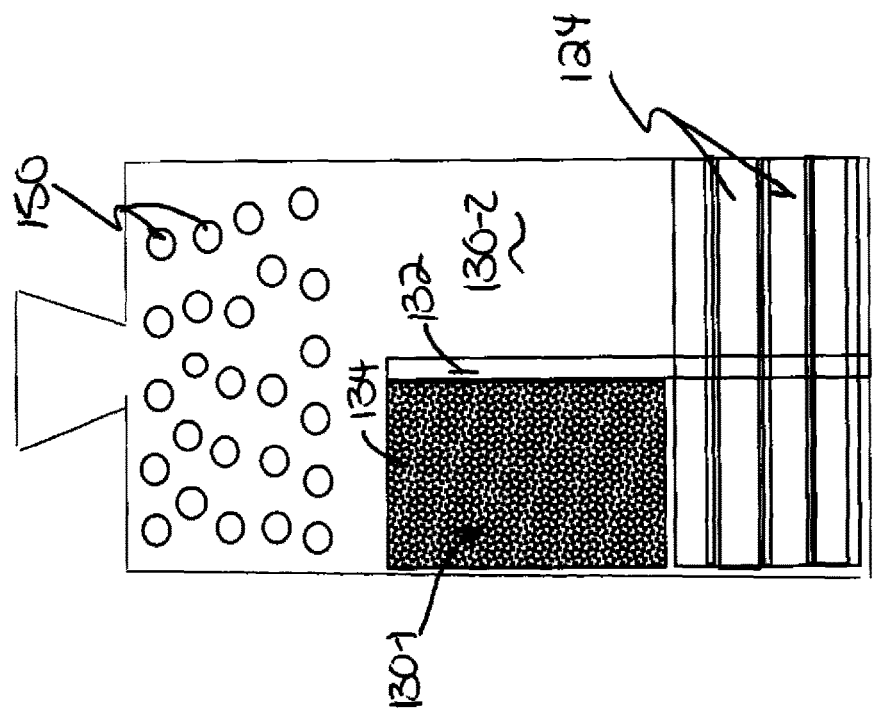
FIG. 3A is a schematic illustration of a simulation using a random propensity input to randomly assign subject elements to a treatment path and a non-treatment path of a ramp structure.
Figure 3C:
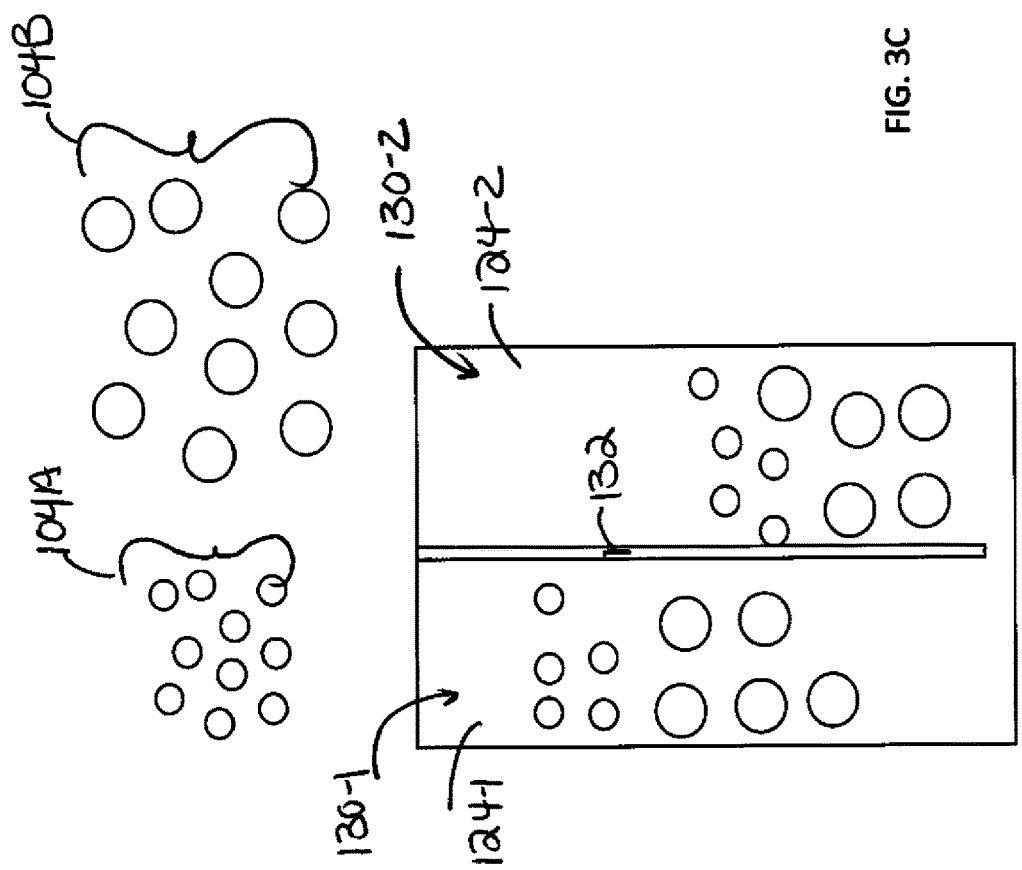
FIGS. 3B-3C illustrate output measures or distribution for different subject elements having a random assignment and treatment input simulated via the ramp structure illustrated in FIG. 3A.
Figure 3B:
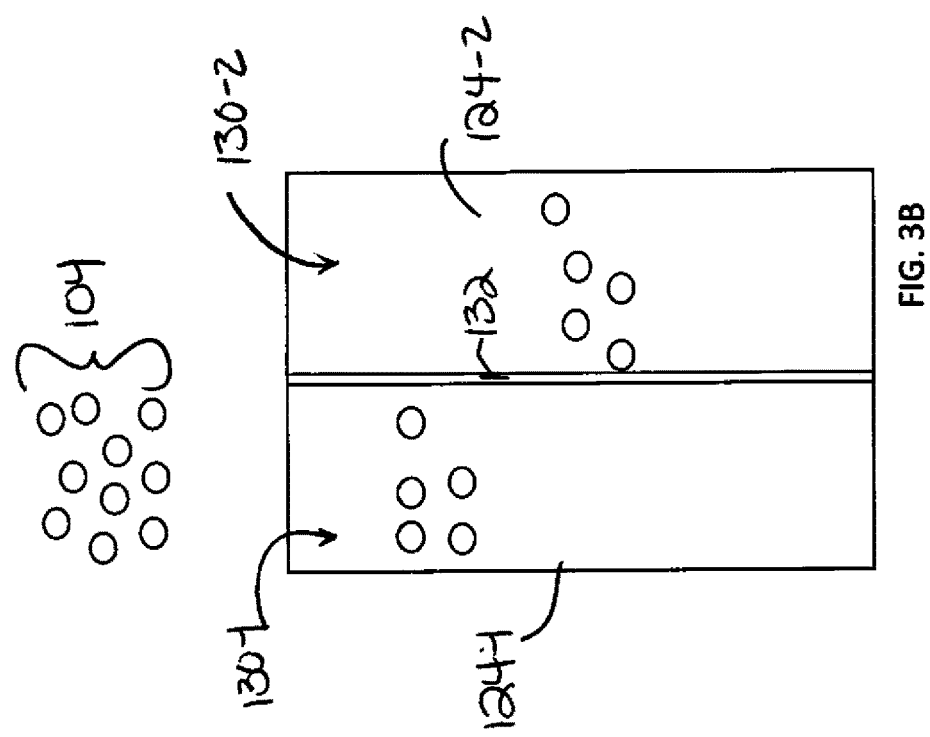

FIGS. 3A-3C schematically illustrate different simulations for a random propensity input or assignment for subject elements 104 to follow the treatment path 130-1 and the non-treatment path 130-2. As shown, schematically shown in FIG. 3A, the treatment path 130-1 has a higher friction or textured surface to retard momentum of the balls 104 along the treatment path 130-1. Illustratively, a felt pad is provided along the treatment path 130-1 to increase the surface friction along the treatment path 130-1 to reduce momentum of the balls 104. As shown in FIGS. 3B-3C, the subject elements that follow the treatment path 130-1 have lower output distances or measure than the subject elements that follow the non-treatment path 130-2. In the simulation shown in FIG. 3B, the subject elements 104 are the same while in FIG. 3C, the subject elements 104A, 104B have different weight, size and friction characteristics.

FIG. 3B illustrates output from a simulation for a set of uniform balls 104 or subject elements using the random propensity input to assign the subject elements to the treatment and non-treatment paths 130-1, 130-2. In the illustrated embodiment, the balls 104 have the same acceleration and velocity parameters along the ramp surface except along the treatment path 130-1. As shown, the balls 104 that follow the treatment path 130-1 have a smaller travel distance or measure than the balls 104A that followed the non-treatment path 130-2. Thus, it can be concluded that the treatment input (i.e. increased friction) of the treatment path 130-1 is effective in altering the output measure as compared to the non-treatment path 130-2.

FIG. 3C illustrates the same simulation using a random propensity input and treatment paths 130-1, 130-2 shown in FIG. 3A-3B for balls 104A, 104B having different characteristics, such as weight, density or surface friction, that affect momentum or movement of the balls 104A, 104B along the ramped surface 122. As illustrated in FIG. 3C, overall, the subject elements or balls 104A-104B that followed the treatment path 130-1 have a shorter output distance than the balls 104A-104B that followed the non-treatment path 130-2 suggesting that treatment is effective to reduce the output distance of the balls 104A, 104B. However, as can be observed, some of the balls 104A, 104B that followed the treatment path 130-1 have a longer output distance or measure than balls 104A, 104B that followed the non-treatment path 130-2 due to variations in the characteristics, or weight of the subject elements or balls 104A, 104B.

FIGS. 3D-3G illustrate different one-way propensity inputs. FIG. 3D illustrates a one-way input to the treatment path 130-1 and FIG. 3F illustrates a one-way assignment input to the non-treatment path 130-2. As shown in FIG. 3D, an angled barrier structure 170A provides the one-way assignment input to the treatment path 130-1 as shown by arrow 172A to direct the balls toward the treatment path 130-1 to provide a controlled assignment input to the treatment path 130-1. In a simulation using the one-way assignment input toward the treatment path 130-1, there is an observed outcome score variation due to the variety of balls 104A, 104B as shown in FIG. 3E. The same observation is true for a simulation outcome shown in FIG. 3G for the one-way non-treatment assignment input to the non-treatment path 130-2 via the barrier structure 170B as shown in FIG. 3F. As shown, the angled barrier structure 170B direct the balls 104A, 104B to the non-treatment path 130-2 as illustrated by arrow 172B in FIG. 3F.

As comparatively shown in the illustrated output results for FIGS. 3E and 3G, the mean outcome distances of the non-treatment path 130-2 is lower or smaller than the treatment path 130-1 illustrating the effect of treatment to decrease the output distance. Often in statistical studies, the same subject elements or population cannot be assigned to the treatment path and the non-treatment path simultaneously. However the tool of the present application allows for simulation of treatment and non-treatment of the same subject elements using the one-way assignment inputs to the treatment path 130-1 and the non-treatment path 130-2 as shown.

FIGS. 3H-3I illustrate alternate embodiments of a one way propensity input mechanism. As shown, the one-way propensity mechanism includes a hopper 180 movable along a track 182 (schematically shown). The position of the hopper 180 is moveable as illustrated by arrow 184 to selectively align the hopper 160 with the treatment path 130-1, and the non-treatment assignment path 130-2 to adjust the propensity for the subject element balls. In another embodiment, multiple hoppers 180-2, 180-3 selectively dispense balls 104 to the treatment assignment path 130-1 and the non-treatment assignment path 130-2. It should be noted that any number of hoppers 180 can be used to provide the propensity input to the balls or subject element 104 to following the treatment path 130-1 or the non-treatment path 130-2.

Figure 3K:
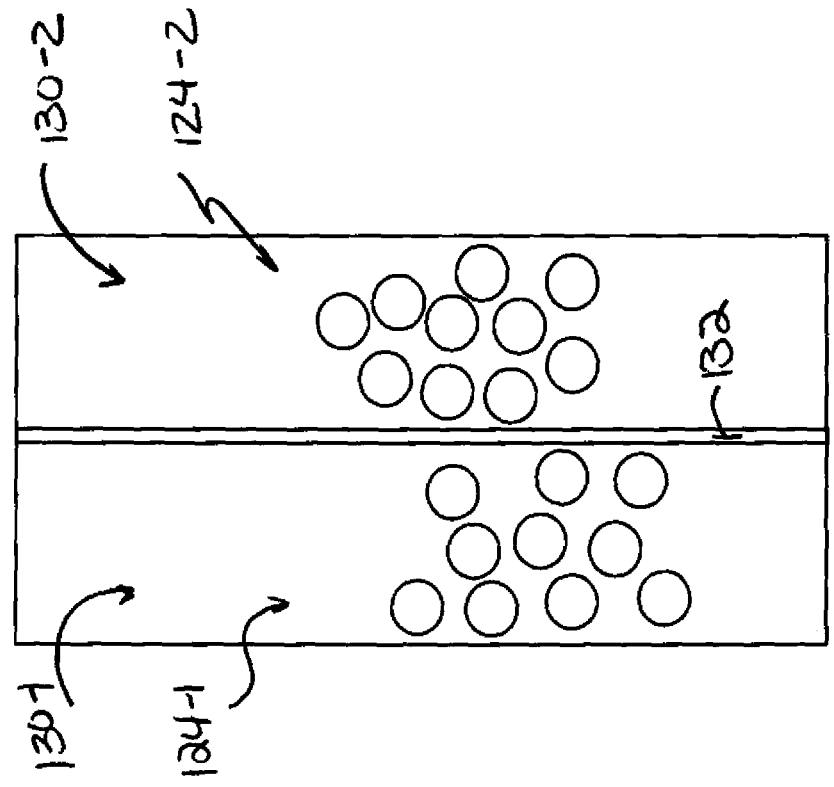
FIG. 3K illustrates an output measure or distribution for a simulation using the confounding input mechanism shown in FIG. 3J.
Figure 3J:
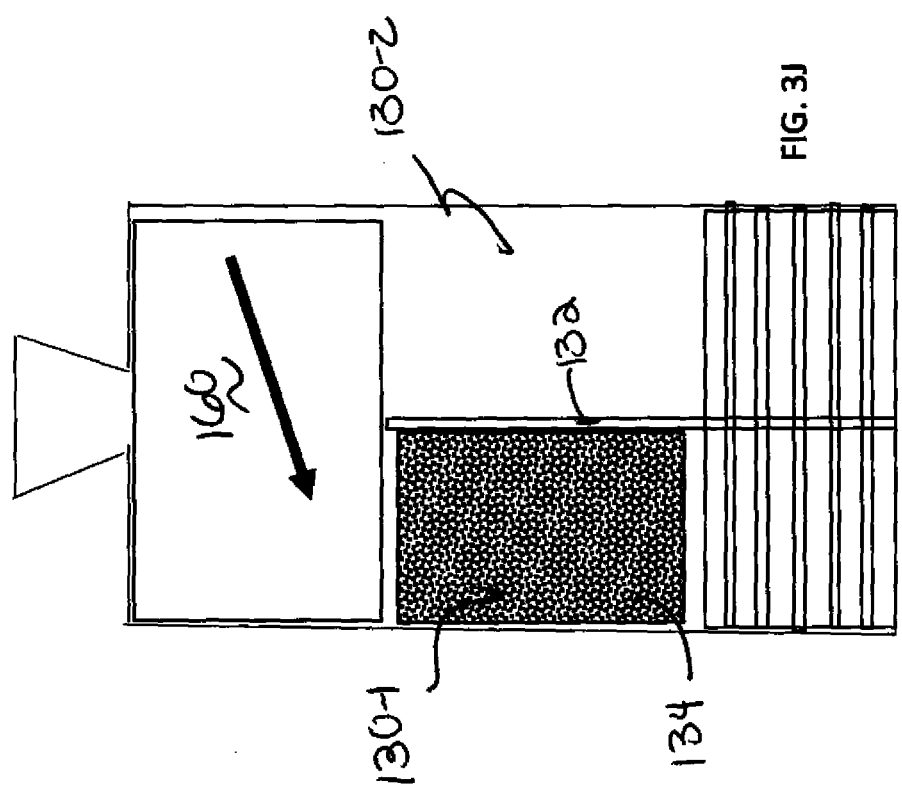
FIG. 3J illustrates a ramp structure having a biased propensity and confounding input mechanism as shown in FIG. 2F.

FIGS. 3J-3K illustrate an embodiment of the tool using the sloped manipulative device 160 which provides a non-ignorable input for the subject elements 104. As previously described, the manipulative device 160 is sloped towards the treatment path 130-1 to increase the propensity for the subject elements 104 to follow the treatment path 130-1 as compared to the non-treatment path 130-2 depending upon the characteristics of the subject elements and impart a confounding input to the subject elements to mask the applied treatment. FIG. 3K illustrates an output measure or distribution for a simulation using the manipulative device 160 which illustrates the effect of the confounding input with respect to the output relation between treatment and non-treatment subject elements. As shown, the results appear counter intuitive since the balls that followed the treatment path 130-1 have longer output distances than the balls that followed the non-treatment path 130-2 even though the treatment is designed to slow the balls. Thus the outcome data seemingly indicates ineffective treatment, but this is only due to the confounding input, not due to the treatment itself, which is actually effective. In the embodiment shown, the confounding input provided by manipulative device 160 increases momentum while the treatment decreases momentum. In other embodiments (not shown), the treatment increases momentum and the confounding input decreases momentum. In other illustrations both the confounding input and treatment input increase or decrease momentum to simulate different confounding variables and inputs.

In an illustrated embodiment, the tool 100 is used for teaching the principle of propensity matching to analyze the effect of treatment on a diverse population of subject elements. As shown in FIG. 4, the tool includes subject element 104A-104L that have different characteristics. In the particular embodiment shown, the elements 104A-104L have a different combination of weight, surface friction and size attributes. The different attributes include a heavy weight or light weight, high friction, low friction, large size and small size and each of the attributes affects how the treatment acts. Weight, friction and size attributes of the balls affects the propensity of each ball to follow the treatment path 130-1 or non-treatment path 130-2 as indicated by possible value of propensity for treatment score or measure 190 in FIG. 4. The propensity of subject elements 104A-104L to follow the treatment path 130-1 compared to the non-treatment path 130-2 is measured using the device illustrated in FIG. 3J with the sloped manipulative device 160. The propensity score for each ball or subject element is estimated via multiple trials. The propensity is measured by rolling each ball 104A-104L along the ramp and counting the number of times each ball follows the treatment path 130-1 relative to the non-treatment path 130-2. The heavier, lower friction subject elements or balls 104A-104L will have a greater propensity to follow the treatment path 130-1 than the lighter, higher friction subject elements or balls 104A-104L.

Knowing propensity scores for each ball 104A-104 allows for propensity score matching to be performed on the outcome results of a simulation that applies a confounding input via the sloped manipulative device 160. In an illustrated example, should subject element 104I happen to have been treated, it can be matched with ball or subject element 104L since both element 104I and 104L have a similar propensity score. Additional subject elements can be matched using the propensity score. For example subject element 104D having a propensity score of 0.4 is matched to subject elements 104F, 104H having a similar propensity score. Should blocks 215 shown in FIG. 5C be placed so that conditional on these attributes treatment assignment is strongly ignorable, then propensity score matching could be used in place of matching on the various attributes, should matching on various attributes not be feasible. The propensity score for each ball is estimated by subjecting each ball to multiple trials.

FIGS. 5A-5C illustrate embodiments of different insets for adapting the ramp structure 120 for different propensity inputs. The inset 200 shown in FIG. 5A includes the pattern of pegs 150 to provide the random propensity input shown in FIG. 2D to the subject elements. Inset 200 is removably inset into the ramp structure 120 via placement in an inset cavity 202 along the ramp surface 122 or on top of platform section 140-1. FIG. 5B illustrates an embodiments of a manipulative inset 204 for providing a propensity and confounding input to the subject elements. Different insets 204 can be used having different slopes to simulate different propensity values and inputs.

FIG. 5C illustrates an embodiment of an inset 210 providing an ignorable propensity and confounding input. As shown, the inset 210 includes a raised edge providing an inclined surface 212 sloped in the direction of the treatment path 130-1 as illustrated by arrow 214 and angled entry blocks 215 positioned below the inclined surface 212 to reduce the speed or momentum of the subject elements accelerated along the inclined sloped surface 212. Thus the confounding input is masked by the blocks 215 which slows momentum of the subject elements prior to the treatment path 130-1 and non-treatment paths 130-2. Since the balls are slowed by blocks 215, the positive momentum input of the inclined surface 212 is eliminated to simulate the ignorable treatment assignment.

Figure 6A:
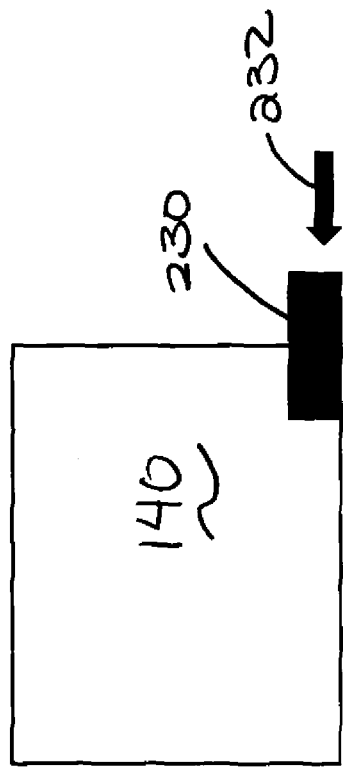
FIGS. 6A-6C illustrate embodiments of a ramp structure having adjustable inclines for providing a propensity/manipulative input mechanism for the ramp structure illustrated in FIG. 2A.
Figure 6B:
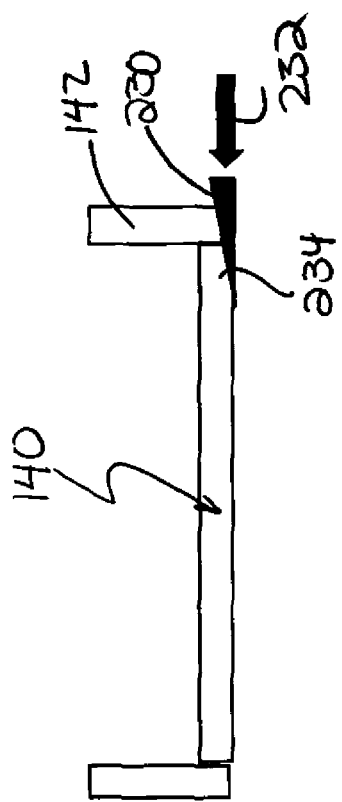
Figure 6C:
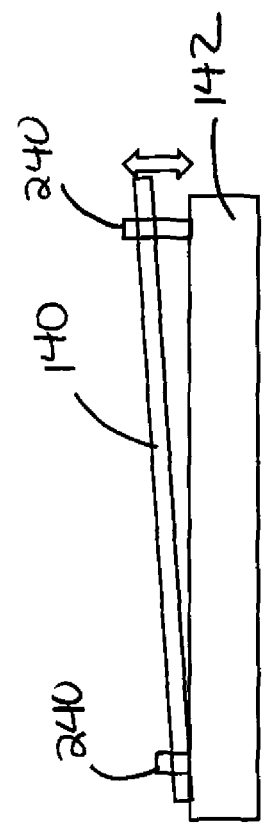

FIGS. 6A-6C illustrates different propensity mechanisms for adjusting the inclination of the ramp surface 122 (i.e. platform section 140-1) to provide a desired propensity input or manipulative input. FIG. 6A is a side view and FIG. 6B is a top view. In the embodiment shown in FIGS. 6A-6B, the incline of the platform 140 (or ramp section) is adjusted via a wedge 230 movable as illustrated by arrow 232 to raise and lower an elevation of edge 234 to adjust the magnitude of the incline slope. In the embodiment illustrated in FIG. 2C, the slope can be adjusted by adjusting the height elevation of the dowels 144 on one side of the frame 142 higher or lower than the other side of the frame 142. As shown in the side view of FIG. 6C, the platform 140 is coupled to the ramp structure 120 via screws 240. The elevation of the screws 240 are individually adjusted as shown in FIG. 6C to provide the adjustable incline slope. The platform 140 can be coupled to the ramp structure 120 directly via the screws 240 or can be connected to an inset which is coupled to the ramp structure as previously described in FIGS.

FIGS. 7A-7B illustrate embodiments of different treatment insets 240, 242 for insertion into inset cavity 202 along the ramp surface 120 or on top of platform section 140-2 to provide different treatment inputs to the subject elements 104. Each of the treatment insets shown in FIGS. 7A-7B include a treatment path 130-1 and a non-treatment or control path 130-2. In the embodiment illustrated in FIG. 7A, the treatment path 130-1 includes an increased surface friction pad 244 and in the embodiment shown in FIG. 7B, the treatment path 130-1 includes the pad 244 in addition to a magnet 246 that imparts a magnetic input in addition to the increased surface friction to provide compound treatment variables. The magnetic treatment input is applied via an embedded magnet. In an embodiment shown in FIG. 7C, the inset 248 includes multiple treatment paths 130-1, 130-3 in addition to a non-treatment path 130-2. The multiple treatment paths 130-1, 130-3 include different friction inputs or other inputs that increase or decrease momentum of the balls or subject elements. Although FIG. 7C illustrates treatment paths 130-1, 130-3, and non-treatment path 130-2, application is not limited to a particular number of paths as will be appreciated by those skilled in the art.

Figure 8A:
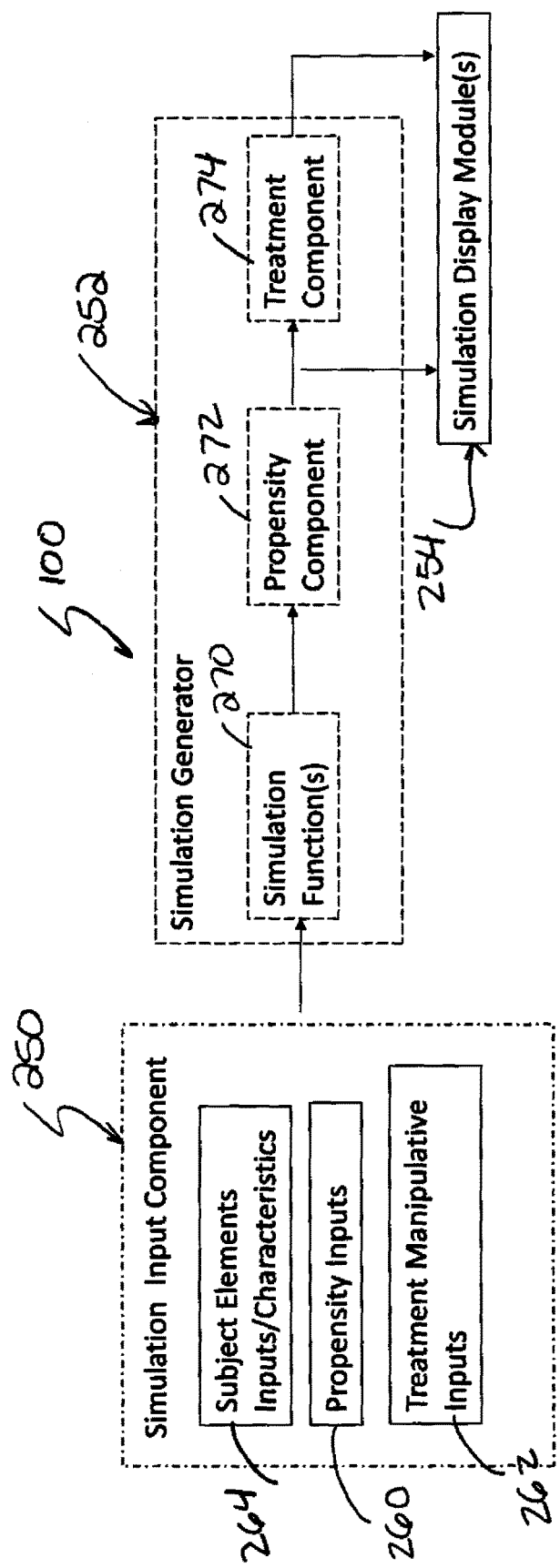
FIGS. 8A-8C illustrate an embodiment of a statistics teaching tool implemented through an applet via instructions stored on one or more data storage devices and implemented through one or more processing units.

FIG. 8A schematically illustrates an embodiment of the simulation tool 100 as an application program including instructions stored on one or more memory or data storage devices. As shown in FIG. 8A, the application tool includes a simulation input component 250, a simulation generator 252 and a graphical display module 254. As shown, the input component 250 includes selections for propensity inputs 260, treatment inputs 262 and subject elements inputs 264. As shown, the simulation generator 252 receives the inputs from the simulation input component 250 to calculate an output score or measure for different subject elements in response to the propensity, treatment and other inputs. As shown, the simulation uses simulation functions or algorithms 270 to calculate the output score or measure for subject elements 104 based upon the characteristics of the subject elements as represented below.

Output score=f{characteristics of the subject element}

A propensity component 272 uses propensity algorithms to assign the subject elements to treatment or no-treatment based upon the input propensity 260. The treatment component 274 applies a treatment algorithm or multiplier to the subject elements assigned to the treatment to increase or decrease the output score or measure for the subject elements assigned to treatment based upon the treatment inputs. Additional algorithms or functions can be used to assign subject elements to treatment and apply confounding inputs to increase or decrease the output measure or distribution. The graphical display module(s) 254 uses output from the simulation generator 252 to output a graphical display of the outcome measurements of the simulation.

Figure 8B:
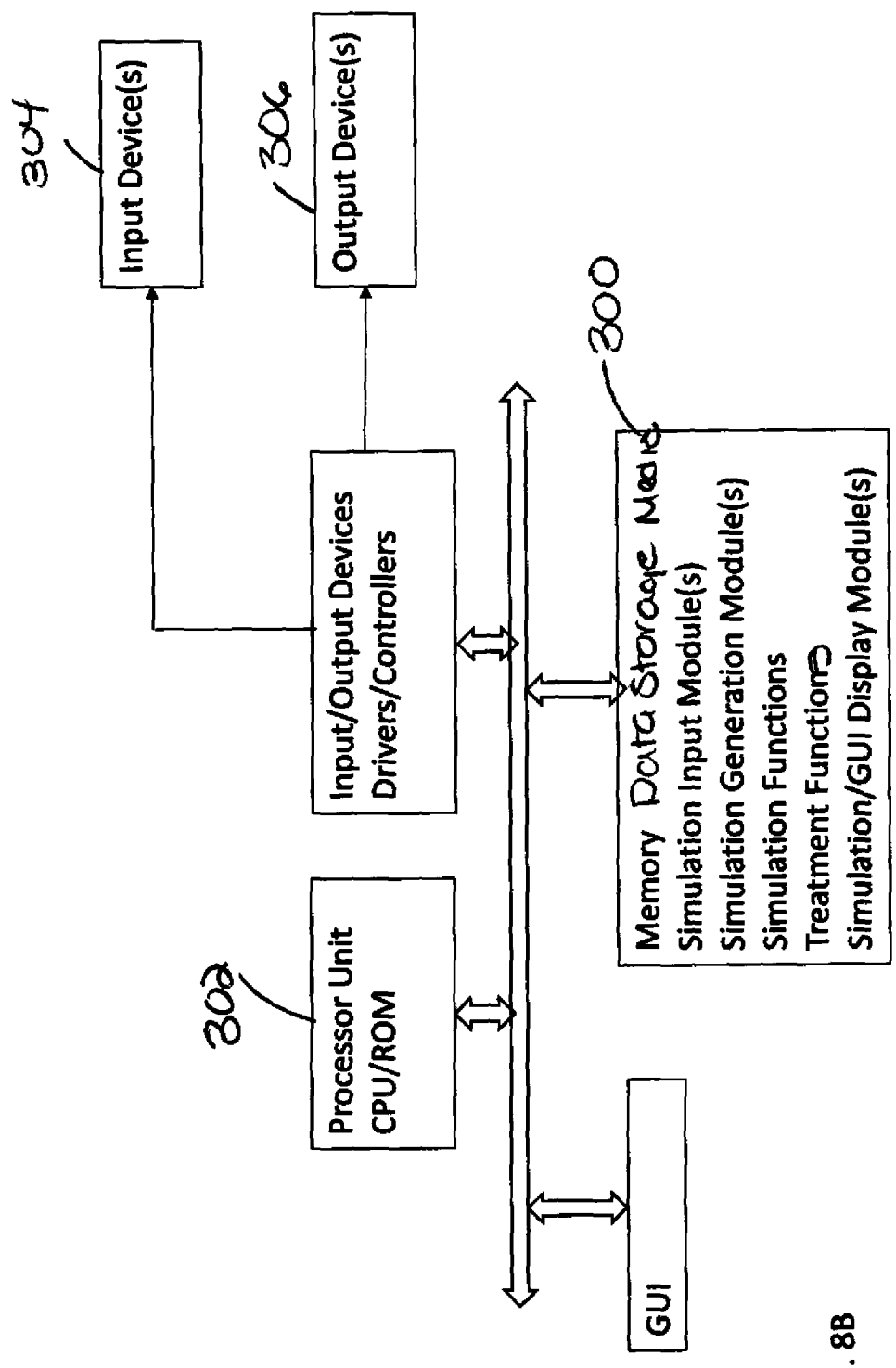

The application tool shown in FIG. 8A is implemented on a computer device including memory or data storage media 300, a processing unit 302 and input and output devices 304, 306 including keyboards, touch screens, pointing devices, graphical display screens or monitors as shown in FIG. 8B. The input selections 250 and simulation modules 252 are stored in the memory 300 and are implemented via the processing unit 302 to apply the treatment inputs to generate the output measurements or scores. The input selections are received through the input devices 304. The different simulation modules use mathematical functions to calculate the output measurement for the subject elements 104 responsive to the characteristics of the subject elements and the propensity and treatment inputs.

In one embodiment, the simulation generator 252 simulates the treatment inputs for balls 104 rolling on a simulated ramp structure and the output display module 254 displays a representation of the ramp structure 120 and output measurements on a representation of the ramp structure as illustrated in FIG. 2A. In particular, in an illustrated embodiment, the display modules 254 output a graphical user interface (GUI) illustrating in elapsed time the subject elements moving along the treatment and non-treatment paths and output measures or score distributions for the treated and non-treated subject elements. Although FIG. 8B illustrates modules stored on a local device, the modules and program instructions can be stored on a remote or network device and accessed through the internet or the world-wide-web.

Figure 8C:
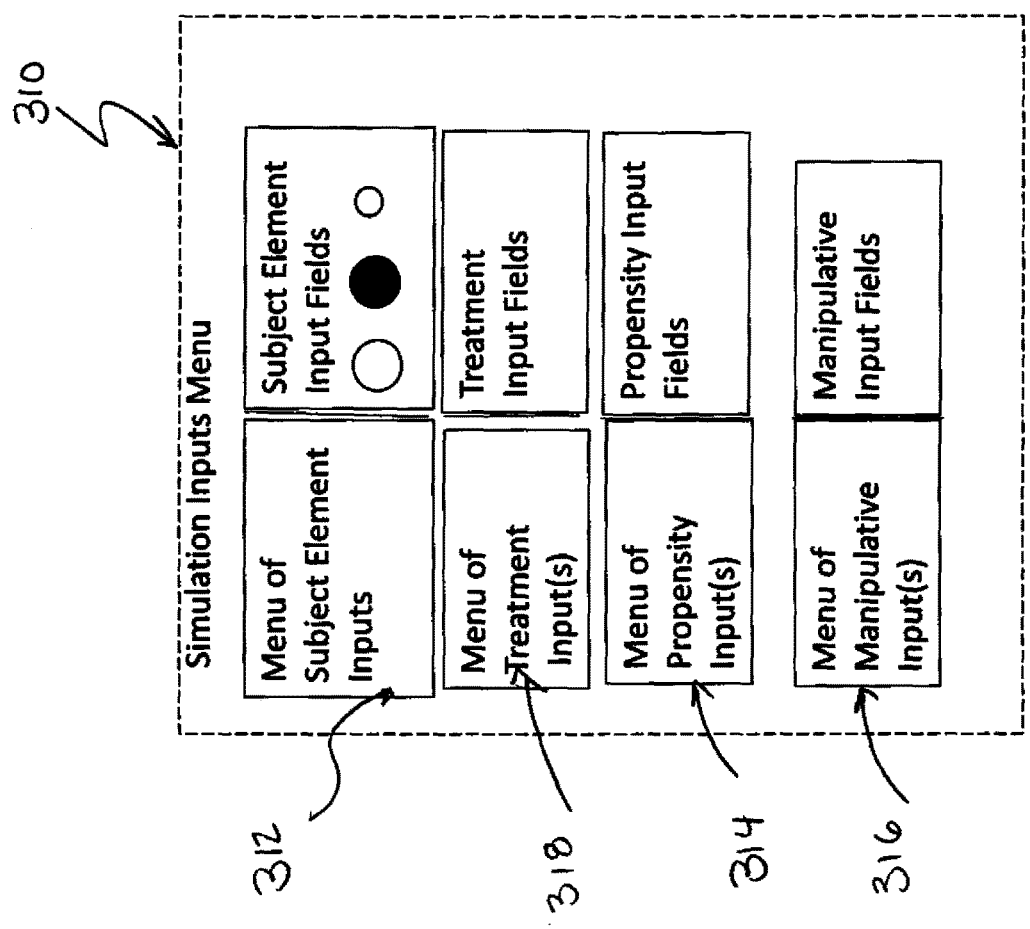

FIG. 8C illustrates a graphical user interface for the simulation input component 250. As shown, the GUI menu 310 includes a menu of subject elements 312, propensity inputs 314, optional manipulative inputs 316 and treatment inputs 318. The graphically user interface includes input fields for the subject elements, propensity inputs, treatment inputs and manipulative inputs. The user selects subject elements, propensity and other inputs from the menus 312, 314, 316, 318. As shown, the subject elements include elements having different sizes and characteristics. The propensity inputs include a random propensity input, a biased propensity input, and menu for selecting a propensity value for individual subject elements or group of subject elements. The user can also select the treatment type and magnitude as well as other inputs (or manipulative inputs) via the simulation input menus and input fields. As previously described in FIG. 8A, the simulation generator 252 utilizes simulation algorithms to assign the subject elements to treatment and algorithms to apply treatment inputs to mathematically simulate and display outcomes for selected treatment and propensity inputs.

As appreciated by those skilled in the art, application of the features of the present invention is not limited to the particular embodiments of the present application and different embodiments can be used to implement features described in the present application. Furthermore elements or components described herein can be used in different combinations to simulate different statistics models or data patterns. It should be understood that the FIGS. of the application are illustrative and are not necessarily drawn to scale. Other embodiments of the device include different confounding inputs or manipulative devices that impart different inputs to increase or decrease momentum as described and application is not limited to the particular propensity input mechanisms shown.

What is claimed is:

1. An instructional tool for teaching statistic concepts comprising:
    a ramp structure including an inclined ramp surface having a top and a bottom and the ramp structure including first and second paths separated by a divider along the ramp surface;
    at least one treatment device to increase or decrease momentum of subject elements along the first path relative to the second path to form a treatment path and a non-treatment path;
    a scoring surface at the bottom of the inclined ramp surface to provide an output distance of the subject elements rolling down the inclined ramp surface along the treatment path and the non-treatment path; and
    a propensity input device above the treatment path and non-treatment path to apply a propensity input to the subject elements to provide a propensity for the subject elements to follow the treatment path as opposed to the non-treatment path.

2. The instructional tool of claim 1 wherein the subject elements include a plurality of balls having a same weight, size and friction characteristics and a plurality of balls having one or more of a different weight, size and friction characteristic for use in combination with the ramp structure.

3. The instructional tool of claim 1 wherein the ramp structure includes a frame and a plurality of sections adjustably coupled to the frame via pins insertable into of a plurality of slots spaced at different height elevations on the frame to adjust an inclination angle of the plurality of sections.

4. The instructional tool of claim 1 wherein the at least one treatment device is a pad having an increased surface friction relative to the inclined ramp surface along the non-treatment path.

5. The instructional tool of claim 1 wherein the scoring surface includes a plurality of stepped scoring tiles.

6. The instructional tool of claim 5 wherein the scoring tiles are non-uniformly spaced.

7. The instructional tool of claim 1 wherein the propensity input device includes a plurality of rows of pegs along a top portion of the inclined ramp surface above the treatment path and the non-treatment path.

8. The instructional tool of claim 1 wherein the propensity input device includes an input hopper slideably coupled to the ramp structure and movable between opposed sides of the ramp structure to adjust a position of the hopper relative to the treatment path and the non-treatment path to change propensity for the subject elements to follow either the treatment path or the non-treatment path.

9. The instructional tool of claim 1 wherein the propensity input device includes an input hopper having a plurality of spaced bins spaced between opposed sides of the ramp structure and the input hopper is hidgedly coupled to the ramp structure to rotate between a first position and a second position to release the subject elements from one or more of the plurality of bins down the inclined ramp surface.

10. The instructional tool of claim 9 in combination with a plurality of pegs.

11. An instructional tool for teaching statistic concepts comprising:
 a ramp structure including an inclined ramp surface having a top and a bottom and the ramp structure including first and second paths separated by a divider along the ramp surface;
 at least one treatment device to increase or decrease momentum of subject elements along the first path relative to the second path to form a treatment path and a non-treatment path;
 a scoring surface at the bottom of the inclined ramp surface to provide an output distance of the subject elements rolling down the inclined ramp surface along the treatment path and the non-treatment path; and
 a confounding input device above the treatment path and the non-treatment path to provide a confounding input to the subject elements above the treatment path and the non-treatment path.

12. The instructional tool of claim 11 wherein the confounding input device comprises a manipulative structure having a sloped surface formed by a raised edge proximate to a first side of the ramp structure and a non-raised edge having a height elevation below the raised edge proximate to a second side of the ramp structure opposite to the first side of the ramp structure.

13. The instructional tool of claim 12 wherein the manipulative structure includes an adjustable platform to adjust a height elevation of the raised edge relative to the non-raised edge to adjust an angle of the sloped surface.

14. The instructional tool of claim 12 wherein the raised edge is aligned with the non-treatment path and the non-raised edge is aligned with the treatment path.

15. An instructional tool for teaching statistic concepts comprising:
 a ramp structure including an inclined ramp surface having a top and a bottom and the ramp structure including first and second paths separated by a divider along the ramp surface;
 at least one treatment device to increase or decrease momentum of subject elements along the first path relative to the second path to form a treatment path and a non-treatment path;
 a scoring surface at the bottom of the inclined ramp surface to provide an output distance of the subject elements rolling down the inclined ramp surface along the treatment path and the non-treatment path; and
 wherein the at least one treatment device includes at least one treatment inset sized for insertion into an inset cavity along the inclined ramp surface and the at least one treatment inset has a treatment input to increase or decrease momentum along the treatment path relative to the non-treatment path.

16. The instruction tool of claim 15 wherein the at least one inset includes a treatment surface having an increased friction relative to a non-treatment surface to reduce momentum along the treatment path relative to the non-treatment path to provide the treatment input.

17. The instructional tool of claim 15 and comprising a manipulative inset having a leading edge and a trailing edge and the trailing edge having a raised edge and a non-raised edge to form a sloped surface between the raised edge and the non-raised edge and the manipulative inset is positionable in an inset cavity along the inclined ramp surface above the treatment and non-treatment paths.

18. The instructional tool of claim 17 wherein the manipulative inset comprises a plurality of entry blocks spaced to provide a passage therebetween and each of the plurality of entry blocks having a sloped leading edge to direct the subject elements towards the passage.

19. The instructional tool of claim 15 and comprising a manipulative inset insertable into an inset cavity along the inclined ramp surface above the treatment path and the non-treatment path and the manipulative inset including a plurality of rows of pegs.

\* \* \* \* \*